(12) United States Patent
Fan et al.

(10) Patent No.: US 9,590,633 B2
(45) Date of Patent: Mar. 7, 2017

(54) CARRY-SKIP ONE-BIT FULL ADDER AND FPGA DEVICE

(71) Applicant: CAPITAL MICROELECTRONICS CO., LTD., Beijing (CN)

(72) Inventors: Ping Fan, Beijing (CN); Jia Geng, Beijing (CN); Yuanpeng Wang, Beijing (CN)

(73) Assignee: Capital Microelectronics Co., Ltd., Beijing (CN)

( * ) Notice: Subject to any disclaimer, the term of this patent is extended or adjusted under 35 U.S.C. 154(b) by 38 days.

(21) Appl. No.: 14/761,403

(22) PCT Filed: Dec. 11, 2014

(86) PCT No.: PCT/CN2014/093566
§ 371 (c)(1),
(2) Date: Jul. 16, 2015

(87) PCT Pub. No.: WO2016/090596
PCT Pub. Date: Jun. 16, 2016

(65) Prior Publication Data
US 2016/0344391 A1    Nov. 24, 2016

(51) Int. Cl.
*G06F 7/38* (2006.01)
*H03K 19/173* (2006.01)
*G06F 7/501* (2006.01)

(52) U.S. Cl.
CPC ......... *H03K 19/1737* (2013.01); *G06F 7/501* (2013.01)

(58) Field of Classification Search
CPC ........ G06F 7/501; G06F 7/5013; G06F 7/502; G06F 1/0328; H03K 19/1737
See application file for complete search history.

(56) References Cited

U.S. PATENT DOCUMENTS

| | | | | |
|---|---|---|---|---|
| 5,642,382 A * | 6/1997 | Juan | ............... | H03H 17/0292 348/725 |
| 6,130,553 A * | 10/2000 | Nakaya | ............... | H03K 19/1737 326/37 |
| 6,556,044 B2 * | 4/2003 | Langhammer | .......... | G06F 7/523 326/39 |
| 2003/0055861 A1 * | 3/2003 | Lai | ............... | G06F 7/57 708/620 |
| 2005/0187998 A1 * | 8/2005 | Zheng | ............... | H03K 19/17732 708/523 |
| 2006/0190516 A1 * | 8/2006 | Simkins | ............... | G06F 7/02 708/490 |

* cited by examiner

*Primary Examiner* — Jason M Crawford
(74) *Attorney, Agent, or Firm* — Buchanan Ingersoll & Rooney PC

(57) ABSTRACT

A carry-skip one-bit full adder and a field programmable gate array device, the full adder includes: a first multiplexer, a second multiplexer, and an adder, the first multiplexer includes a first addend input end and a first constant input end configured to input a first constant to the first multiplexer; the second multiplexer includes a second addend input end and a second constant input end configured to input a second constant to the second multiplexer; when the first addend input end is not used for input of a first addend, and/or when the second addend input end is not used for input of a second addend, the first multiplexer selects to output the first constant input, and the second multiplexer selects to output the second constant input.

10 Claims, 5 Drawing Sheets

# CARRY-SKIP ONE-BIT FULL ADDER AND FPGA DEVICE

BACKGROUND

Technical Field

The present invention relates to the field of integrated circuit technologies, and in particular, to a carry-skip one-bit full adder and a field programmable gate array (FPGA) device.

Related Art

An FPGA is a logic device having rich hardware resources, a powerful parallel processing capability and flexible reconfigurability. With these features, the FPGA is widely applied in many fields such as data processing, communications, and networks.

Summation is the most common logical structure, and a main purpose of an internal arithmetical logic structure of the FPGA is to optimize the speed and implementation of summation. In the FPGA, an adder is usually implemented by using a carry chain. However, due to the architectural limitation of the FPGA, usually, a least-significant-bit carry of an n-bit full adder can be input only through a dedicated carry input end at the bottom of a logic element (LE), and therefore, a start position of a carry chain needs to be at the bottom of the LE, which significantly limits the layout.

In addition, if input and output ports of a full adder at any bit on a carry chain are occupied by another logical function, this carry chain will be interrupted. Therefore, when a logical function implemented on an FPGA chip is relatively complex, the number of available carry chains is extremely limited.

SUMMARY

To solve the defects in the prior art, the present invention provides a carry-skip one-bit full adder and an FPGA device, where the one-bit full adder can select input constants, and according to different input constants, the full adder can still propagate a carry signal to a full adder at a higher level when input and output ports are occupied, thereby reducing the possibility of a carry chain being interrupted, or making the full adder capable of generating a determined digital low-level or high-level carry signal that is used as a least-significant-bit carry input of the carry chain, so that a start position of the carry chain is no longer limited by the architecture of the FPGA, but can be any position on the carry chain. In this way, the number of available carry chains on an FPGA chip is increased, which optimizes the layout structure and area of the chip.

According to a first aspect, an embodiment of the present invention provides a carry-skip one-bit full adder, including:

a first multiplexer, a second multiplexer, and a adder, where the first multiplexer includes a first addend input end and a first constant input end, the first constant input end being configured to input a first constant to the first multiplexer; and the second multiplexer includes a second addend input end and a second constant input end, the second constant input end being configured to input a second constant to the second multiplexer; and the first addend input end is not used for input of a first addend, and/or when the second addend input end is not used for input of a second addend, the first multiplexer selects to output the first constant input by the first constant input end, and the second multiplexer selects to output the second constant input by the second constant input end, so that a carry output end of the adder generates a determined additive carry-out signal according to the first constant and the second constant.

Preferably, when either of the first constant and the second constant is a digital high level and the other is a digital low level, the additive carry-out signal is an additive carry-in signal input by a carry input end of the adder.

Further preferably, when in the current full adder, either of the first constant and the second constant is a digital high level and the other is a digital low level, the current full adder transmits the input additive carry-in signal to a carry input end of a next full adder cascaded with the current full adder, so that the input additive carry-in signal is used as an additive carry-in signal of the next full adder.

Preferably, when the first constant and the second constant are both digital high levels, the additive carry-out signal is a digital high level.

Preferably, when the first constant and the second constant are both digital low levels, the additive carry-out signal is a digital low level.

Further preferably, when in the current full adder, the first constant and the second constant are both digital high levels, the current full adder is configured to provide a digital high-level additive carry-in signal for a next full adder cascaded with the current full adder; and when in the current full adder, the first constant and the second constant are both digital low levels, the current full adder is configured to provide a digital low-level additive carry-in signal for a next full adder cascaded with the current full adder.

Preferably, the second multiplexer further includes an inversion logic output control end;

when the inversion logic output control end inputs a digital high-level signal, the second multiplexer outputs the second addend or the second constant; and when the inversion logic output control end inputs a digital low-level signal, the second multiplexer outputs an inverted signal of the second addend or an inverted signal of the second constant.

Preferably, the second multiplexer further includes an inversion logic output control end;

when the inversion logic output control end inputs a digital low-level signal, the second multiplexer outputs the second addend or the second constant; and when the inversion logic output control end inputs a digital high-level signal, the second multiplexer outputs an inverted signal of the second addend or an inverted signal of the second constant.

According to a second aspect, an embodiment of the present invention provides an FPGA device, where the FPGA device includes multiple LEs, each LE includes a logic parcel (LP), and each LP includes two full adders according to the foregoing first aspect;

a carry input end of an adder of the first full adder in a current LP is connected to a carry output end of an adder of the second full adder in a previous LP; a carry output end of an adder of the second full adder in the current LP is connected to a carry input end of an adder of the first full adder in a next LP;

where, in each LP, a carry output end of an adder of the first full adder is connected to a carry input end of an adder of the second full adder.

In the carry-skip one-bit full adder provided by the embodiment of the present invention, a first multiplexer selects to output a constant input by a first constant input end, and a second multiplexer selects to output a constant input by a second constant input end, so that a carry output end of an adder generates a determined additive carry-out signal according to the first constant and the second constant. According to different input constants, the additive carry-out signal may be an additive carry-out signal of a previous full adder or a determined digital low-level or digital high-level additive carry-out signal. In this way, the full adder can still propagate an additive carry signal to a full adder at a higher level when input and output ports are occupied, thereby reducing the possibility of a carry chain being interrupted, or making the full adder capable of generating a determined digital low-level or high-level carry signal that is used as a least-significant-bit carry input of the carry chain, so that a start position of the carry chain is no longer limited by the architecture of the FPGA, but can be any position on the carry chain. In this way, the number of available carry chains on an FPGA chip is increased, which optimizes the layout structure and area of the chip.

The technical solutions of the present invention are described in further detail below with reference to the accompanying drawings and embodiments.

DETAILED DESCRIPTION

To make the objectives, technical solutions, and advantages of the embodiments of the present invention clearer, the following describes the present invention in further detail with reference to the accompanying drawings. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
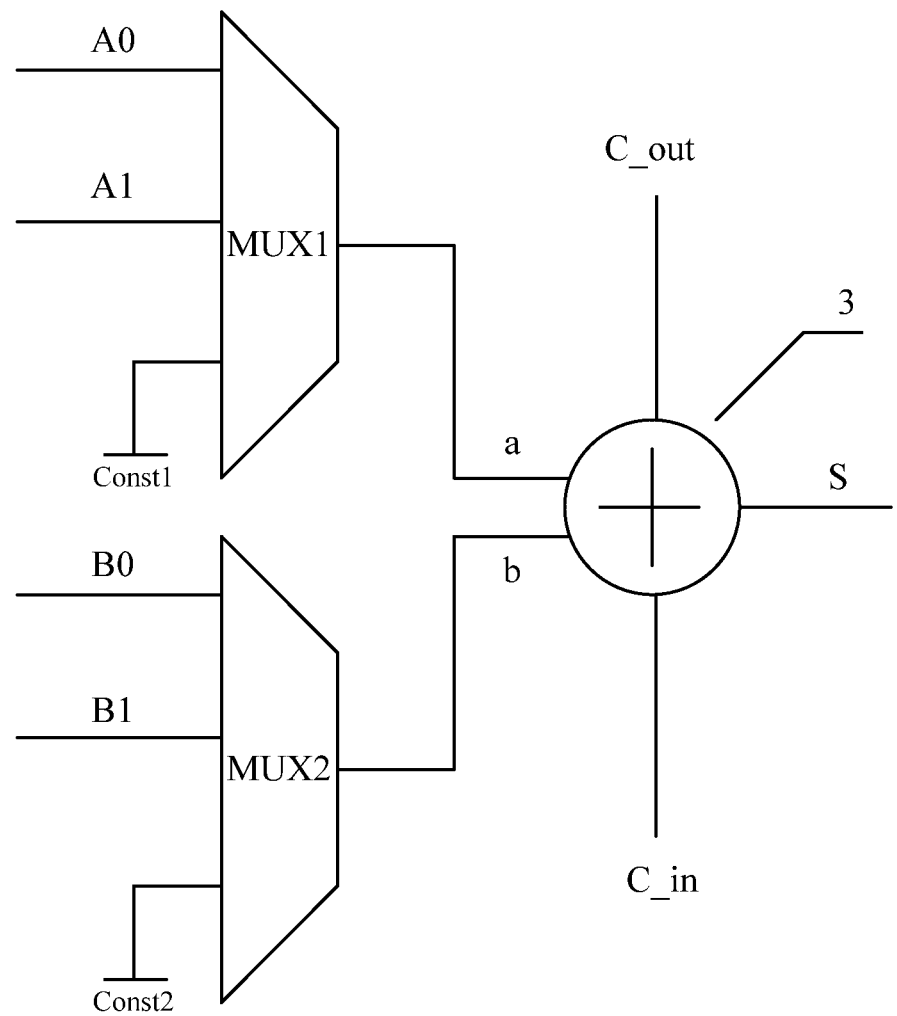
FIG. 1 is a logic schematic diagram of a carry-skip one-bit full adder according to an embodiment of the present invention.

FIG. 1 is a logic schematic diagram of a carry-skip one-bit full adder according to an embodiment of the present invention. As shown in FIG. 1, the carry-skip one-bit full adder includes: a first multiplexer MUX1, a second multiplexer MUX1, and an adder 3.

The first multiplexer MUX1 includes a first addend input end and a first constant input end; and the first addend input end is configured to input a first addend of the full adder to the first multiplexer. Specifically, the first addend may be determined by using the MUX1 to select among multiple pieces of data input by multiple first addend input ends. Therefore, more than one first addend input end may be provided; as shown in FIG. 1, the first addend input end includes an input end for inputting a signal A0 and an input end for inputting a signal A1. The first constant input end is configured to input a first constant Const1 to the first multiplexer MUX1. The first constant Const1 may be a digital high level (1) or a digital low level (0), which may be specifically configured according to the function of the full adder in a carry chain.

The second multiplexer MUX2 includes a second addend input end and a second constant input end; and the second addend input end is configured to input a second addend of the full adder to the second multiplexer. Specifically, the second addend may be determined by using the MUX2 to select among multiple pieces of data input by multiple second addend input ends. Therefore, more than one second addend input end may be provided; as shown in FIG. 1, the second addend input end includes an input end for inputting a signal B0 and an input end for inputting a signal B1. The second constant input end is configured to input a second constant Const2 to the second multiplexer MUX2. The second constant Const2 may be a digital high level (1) or a digital low level (0), which may be specifically configured according to the function of the full adder in a carry chain.

When input and output ports of the adder are occupied by other logic, that is, when the first addend input end is not used for input of the first addend and/or the second addend input end is not used for input of the second addend, the first multiplexer MUX1 selects to output the first constant Const1 input by the first constant input end, and the second multiplexer MUX2 selects to output the second constant Const2 input by the second constant input end, so that a carry output end of the adder 3 generates a determined additive carry-out signal according to the first constant Const1 and the second constant Const2.

Specifically, there may be the following two situations.

In one possible situation, in a carry chain of an FPGA, when the first addend input end and/or second addend input end of a full adder is occupied by other logic and therefore cannot be used for input of an addend, an output end s of the adder 3 cannot output an additive output of this bit. In general cases, this carry chain is interrupted.

However, with the structure of the foregoing full adder provided by the embodiment of the present invention, the first multiplexer MUX1 selects to output the first constant Const1 input by the first constant input end, the second multiplexer MUX2 selects to output the second constant Const2 input by the second constant input end, and it is configured that Const1 is an inverted signal of Const2, so that the carry output end of the adder 3 can send, according to the first constant and the second constant, a signal C_in at a carry input end thereof to the carry output end, and the signal can be delivered to a carry input end of a full adder at a higher level, thereby achieving an effect that a carry signal transmitted from a previous level skips a current full adder and is directly delivered to a carry input end at a higher level. While implementation of other logic is not affected, it is ensured that the carry chain will not be interrupted due to that the input and output ports of the full adder are occupied by other logic.

In the second possible situation, in general cases, an carry input at the least significant bit enters through a dedicated carry input end at the bottom of an LE in an FPGA, and therefore, a start position of a carry chain is limited at the bottom of the LE. If additive logic at the bottom only executes an additive operation of few bits, for example, 2 bits, all six full adders above in the LE cannot but be idle because they are incapable of generating a least-significant-bit carry input.

However, with the structure of the foregoing full adder provided by the embodiment of the present invention, the first multiplexer MUX1 selects to output the first constant Const1 input by the first constant input end, the second multiplexer MUX2 selects to output the second constant Const2 input by the second constant input end, and it is configured that Const1=Const2, so that a carry output end of the adder 3 can constantly output a digital high level (1) or digital low level (0) according to the first constant and second constant, where the carry output end of the adder 3 outputs a digital low level (0) when Const1=Const2=0, and outputs a digital high level (1) when Const1=Const2=1. Therefore, the full adder can be used to generate an additive carry-in signal of a next full adder cascaded with the current full adder. Therefore, the start position of an additive carry chain is no longer limited to being at the bottom of the LE, but can be at any carry unit of the LE. In this way, the number of available carry chains on an FPGA chip can be increased, which optimizes the layout structure and area of the chip.

Figure 2:
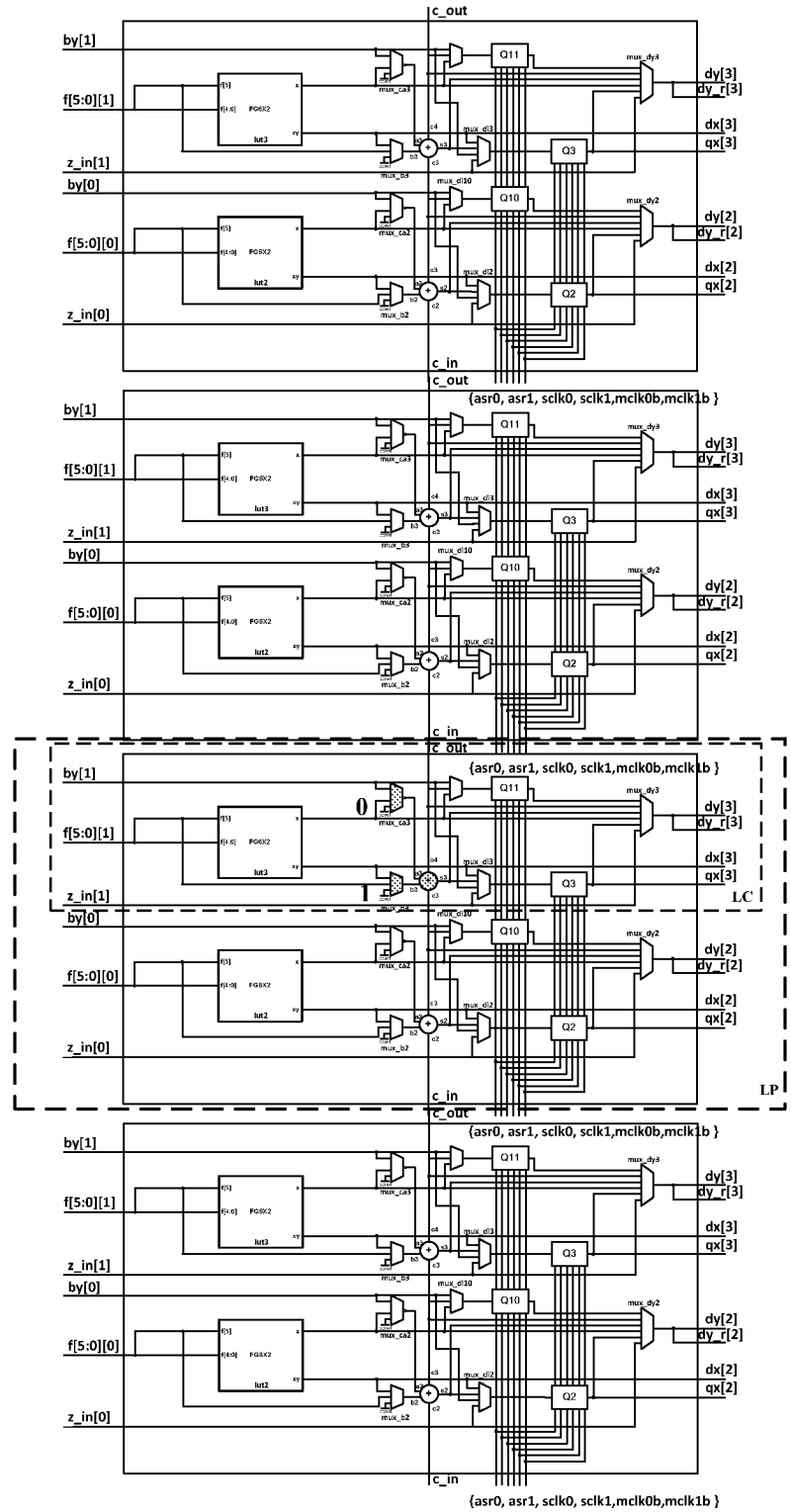
FIG. 2 is a schematic diagram of a carry-skip one-bit full adder in a LE according to an embodiment of the present invention.
Figure 3:
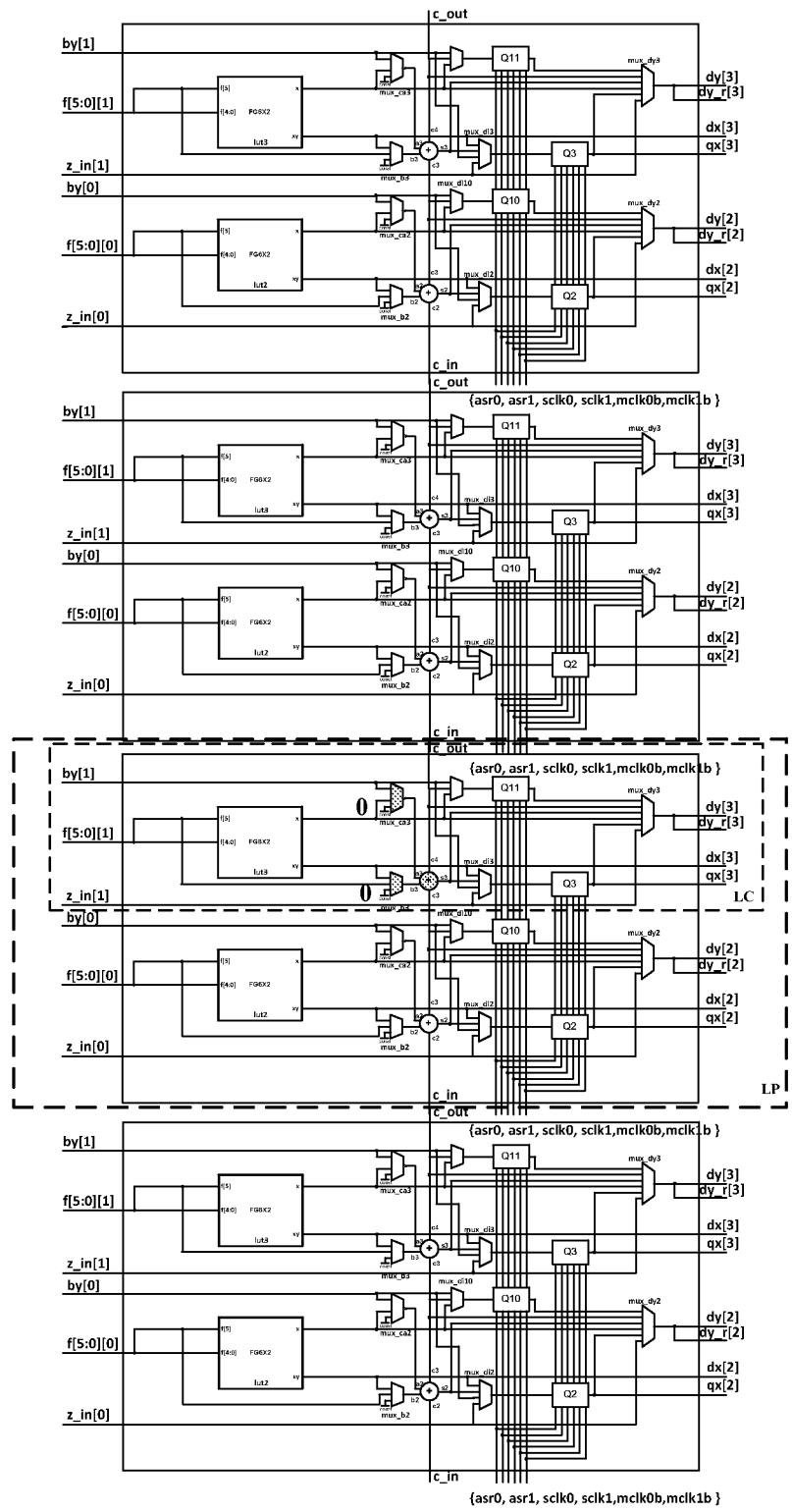
FIG. 3 is another schematic diagram of a carry-skip one-bit full adder in an LE according to an embodiment of the present invention.

The following separately describes the foregoing two situations by using FIG. 2 and FIG. 3 as examples.

For better understanding of the technical solutions of the present invention, first, the structure of an FPGA in the embodiments of the present invention is introduced briefly.

The FPGA of the present invention includes multiple LEs (where FIG. 2 shows one LE structure); each LE includes four LPs, each LP includes two logic cells (LCs), and each LC includes one LUT2, one LUT3, one full adder, and two registers (which are Q2 and Q10, or Q3 and Q11 shown in the figure).

It can be seen from the example shown in FIG. 2 that, in the LC marked as LC in the figure, constant inputs of the full adder are configured to be 0 and 1 respectively. When the input and output of the LC are occupied by other logic and cannot be used to implement additive logic, in the LP on this carry chain, the constants 0 and 1 can still be selected as addends, and the adder in the LC is used to send a carry-in signal C3 thereof (namely, a carry-out signal of a previous LC) to a carry output C4.

The logic expression may be: C4=C3+0+1.

In other words, when C3=1 (namely, when the previous-level adder generates a carry), C4=1; and when C3=0 (namely, when the previous-level adder does not generate a carry), C4=0.

That is, an effect that a carry signal transmitted from a previous level skips a current full adder and is directly delivered to a carry input end at a higher level is produced.

It can be seen from the example shown in FIG. 3 that, in the LC marked as LC in the figure, two input constants of the full adder are configured to be 0 and 0 respectively. Therefore, whether the carry input end of this full adder inputs a digital low level (0) or a digital high level (1), the carry-out signal of the full adder is 0 without being affected. Therefore, when a least-significant-bit carry signal input end (c_in at the bottom) of the LE and three LCs below are used to implement 3-bit additive logic, the LC marked as LC in the figure may be used to deliver a carry signal of a digital low level (0) to an adder of a next-level LC, where the signal is used as a least-significant-bit carry signal of an additive carry chain consisting of the top four adders in the figure, so that in this LE, four LCs above the LC that generates the least-significant-bit carry signal in the current LE may further be used to implement other additive logic.

Certainly, if a least-significant-bit carry signal of a digital high level (1) needs to be transmitted to an adder of a next-level LC, two constants of the input ends of the full adder may be configured to be 1 and 1 respectively, and in this manner, whether the carry input end of the full adder inputs a digital low level (0) or a digital high level (1), a carry-out signal of the full adder is 1 without being affected.

Therefore, with the one-bit full adder of the present invention, a determined digital low-level or digital high-level carry signal can be generated and used as a least-significant-bit carry input of an additive carry chain, so that a start position of the carry chain is no longer limited by the architecture of an FPGA, but can be any position on the carry chain.

Figure 4:
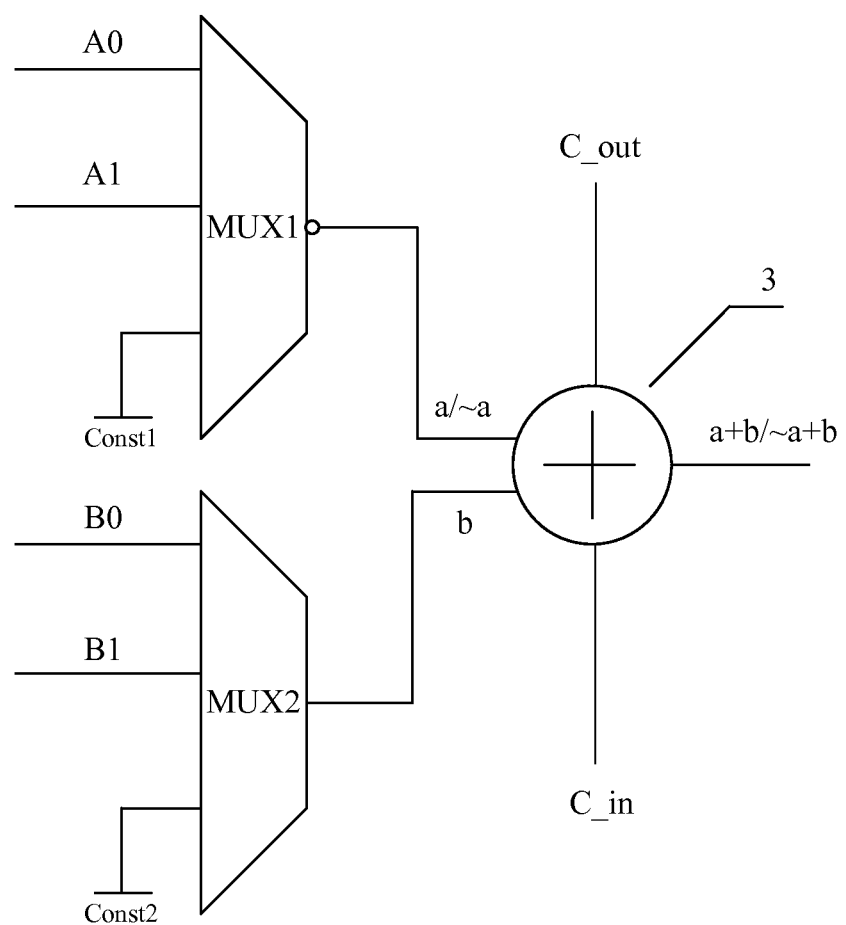
FIG. 4 is a logic schematic diagram of another carry-skip one-bit full adder according to an embodiment of the present invention.

In addition, an output of one multiplexer of the carry-skip one-bit full adder of the present invention has an optional negation logic configuration, as shown in FIG. 4.

Figure 5:
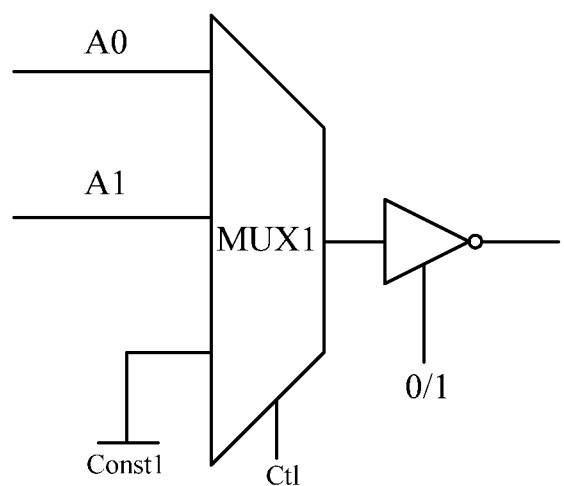
FIG. 5 is a logic schematic diagram of a multiplexer with an optional negation logic configuration according to an embodiment of the present invention.

Whether the first addend a output by the multiplexer is negated or not is determined by a control signal. A logic schematic diagram may be as shown in FIG. 5. It can be seen that, negation logic in FIG. 5 is controlled by the control signal 0/1. For example, when the control signal of an inverter is 0, the first addend a is output; and when the control signal of the inverter is 1, the output first addend is $\neg a$.

Therefore, for a large quantity of operations that need negation and addition, the amount of logic resources used can be greatly reduced, thereby optimizing the layout structure and area of the chip.

A person skilled in the art may be aware that, units and algorithm steps of the examples described with reference to the embodiments disclosed herein may be implemented by electronic hardware, computer software, or a combination thereof. To clearly describe the interchangeability between the hardware and the software, the foregoing has generally described the composition and steps of each example according to functions. Whether these functions are performed by hardware or software depends on particular applications and design constraint conditions of the technical solutions. A person skilled in the art may use different methods to implement the described functions for each particular application, but it should not be considered that the implementation goes beyond the scope of the present invention.

Methods or algorithms described with reference to the embodiments disclosed herein may be implemented by hardware or a software module executed by a processor, or a combination thereof. The software module may be set in a random access memory (RAM), a memory, a read-only memory (ROM), an electrically programmable ROM, an electrically erasable programmable ROM, a register, a hard disk, a removable hard disk, a CD-ROM, or a storage medium in any other form well known in the technical field.

The foregoing specific implementation manners describe objectives, technical solutions, and beneficial effects of the present invention in further detail. However, the foregoing descriptions are merely specific implementation manners of the present invention, but are not intended to limit the protection scope of the present invention. Any modification, equivalent replacement, improvement, and the like made without departing from the spirit and principle of the present invention shall fall within the protection scope of the present invention.

What is claimed is:

1. A carry-skip one-bit full adder, wherein the full adder comprises: a first multiplexer, a second multiplexer, and an adder;

the first multiplexer comprises a first addend input end and a first constant input end, the first constant input end being configured to input a first constant to the first multiplexer; and the second multiplexer comprises a second addend input end and a second constant input end, the second constant input end being configured to input a second constant to the second multiplexer; and when the first addend input end is not used for input of a first addend, and/or when the second addend input end is not used for input of a second addend, the first multiplexer selects to output the first constant input by the first constant input end, and the second multiplexer selects to output the second constant input by the second constant input end, so that a carry output end of the adder generates a determined additive carry-out signal according to the first constant and the second constant.

2. The full adder according to claim 1, wherein when either of the first constant and the second constant is a digital high level and the other is a digital low level, the additive carry-out signal is an additive carry-in signal input by a carry input end of the adder.

3. The full adder according to claim 2, wherein, when in the current full adder, either of the first constant and the second constant is a digital high level and the other is a digital low level, the current full adder transmits the input additive carry-in signal to a carry input end of a next full adder cascaded with the current full adder, so that the input additive carry-in signal is used as an additive carry-in signal of the next full adder.

4. The full adder according to claim 1, when the first constant and the second constant are both digital high levels, the additive carry-out signal is a digital high level.

5. The full adder according to claim 4, wherein, when in the current full adder, the first constant and the second constant are both digital high levels, the current full adder is configured to provide a digital high-level additive carry-in signal for a next full adder cascaded with the current full adder; and when in the current full adder, the first constant and the second constant are both digital low levels, the current full adder is configured to provide a digital low-level additive carry-in signal for a next full adder cascaded with the current full adder.

6. The full adder according to claim 1, when the first constant and the second constant are both digital low levels, the additive carry-out signal is a digital low level.

7. The full adder according to claim 6, wherein, when in the current full adder, the first constant and the second constant are both digital high levels, the current full adder is configured to provide a digital high-level additive carry-in signal for a next full adder cascaded with the current full adder; and when in the current full adder, the first constant and the second constant are both digital low levels, the current full adder is configured to provide a digital low-level additive carry-in signal for a next full adder cascaded with the current full adder.

8. The full adder according to claim 1, wherein the second multiplexer further comprises an inversion logic output control end;

when the inversion logic output control end inputs a digital high-level signal, the second multiplexer outputs the second addend or the second constant; and when the inversion logic output control end inputs a digital low-level signal, the second multiplexer outputs an inverted signal of the second addend or an inverted signal of the second constant.

9. The full adder according to claim 1, wherein the second multiplexer further comprises an inversion logic output control end;

when the inversion logic output control end inputs a digital low-level signal, the second multiplexer outputs the second addend or the second constant; and when the inversion logic output control end inputs a digital high-level signal, the second multiplexer outputs an inverted signal of the second addend or an inverted signal of the second constant.

10. A field programmable gate array (FPGA) device, wherein the FPGA device comprises multiple logic elements (LEs), each element comprises a logic parcel (LP), and each LP comprises two full adders according to claim 1; and a carry input end of an adder of the first full adder in a current LP is connected to a carry output end of an adder of the second full adder in a previous LP; a carry output end of an adder of the second full adder in the current LP is connected to a carry input end of an adder of the first full adder in a next LP;

wherein, in each LP, a carry output end of an adder of the first full adder is connected to a carry input end of an adder of the second full adder.

* * * * *